United States Patent
Toshikawa et al.

(10) Patent No.: US 7,026,257 B2
(45) Date of Patent: Apr. 11, 2006

(54) METHOD OF MANUFACTURING LOW DIELECTRIC FILM BY A VACUUM ULTRAVIOLET CHEMICAL VAPOR DEPOSITION

(75) Inventors: Kiyohiko Toshikawa, Miyazaki (JP); Yoshikazu Motoyama, Miyazaki (JP); Yousuke Motokawa, Miyazaki (JP); Yusuke Yagi, Miyazaki (JP); Junichi Miyano, Miyazaki (JP); Tetsurou Yokoyama, Miyazaki (JP); Yutaka Ichiki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/798,930

(22) Filed: Mar. 6, 2001

(65) Prior Publication Data

US 2002/0025693 A1 Feb. 28, 2002

(51) Int. Cl.
*H01L 21/469* (2006.01)

(52) U.S. Cl. .................. 438/789; 438/790; 438/763

(58) Field of Classification Search ................ 438/789, 438/790, 763, 783, 786; 427/489, 490, 491, 427/492, 493, 494, 495, 496, 497, 509, 578, 427/569, 582–585
See application file for complete search history.

(56) References Cited

U.S. PATENT DOCUMENTS

| | | | | |
|---|---|---|---|---|
| 5,510,158 A | * | 4/1996 | Hiramoto et al. | 427/582 |
| 5,639,699 A | * | 6/1997 | Nakamura et al. | 437/238 |
| 5,661,092 A | * | 8/1997 | Koberstein et al. | 427/515 |
| 5,710,079 A | * | 1/1998 | Sukharev | 438/778 |
| 5,926,740 A | * | 7/1999 | Forbes et al. | 438/763 |
| 5,989,998 A | * | 11/1999 | Sugahara et al. | 438/623 |
| 6,051,321 A | * | 4/2000 | Lee et al. | 428/447 |
| 6,130,118 A | * | 10/2000 | Yamazaki | 438/151 |
| 6,258,407 B1 | * | 7/2001 | Lee et al. | 427/255.28 |
| 6,323,142 B1 | * | 11/2001 | Yamazaki et al. | 438/790 |

FOREIGN PATENT DOCUMENTS

JP 2001-274156 10/2001

OTHER PUBLICATIONS

Bergonzo P. and Boyd I.W. "Rapid photo-deposition of silicon dioxide films using 172 nm VUV light." Electronics Letters, vol. 30, No. 7, Mar. 1994, pp. 606-608.*

(Continued)

*Primary Examiner*—C. Everhart
(74) *Attorney, Agent, or Firm*—Venable LLP; Marina V. Schneller; Michael A. Sartori

(57) ABSTRACT

A method is used for forming a low relative permittivity dielectric film by a vacuum ultraviolet CVD. The film is a silicon organic film (e.g., SiOCH, SiC, SiCH, and SiOF films) that has a controlled relative permittivity and is formed at temperatures below 350° C. The method can control the content of carbon in the film to achieve a desired relative permittivity. A desired relative permittivity can be achieved by: ① controlling the type and flow rate of added gas ($O_2$, $N_2O$) that contains oxygen atoms; ② controlling the flow rate of TEOS; ③ controlling the intensity of light emitted from the excimer lamp; ④ elevating the temperatures of the synthetic quartz window and the gas flowing in the vacuum chamber, and controlling the distance between the synthetic quartz window and the wafer; and ⑤ controlling the temperature of the wafer.

9 Claims, 7 Drawing Sheets

OTHER PUBLICATIONS

N. Takezoe et al., "Improvement of VUV-CVD-deposited Insulating Oxide Films" (abstract), Mar. 2000, p. 833, The Japan Society of Applied Physics and Related Societies.

N. Takezoe et al., "SIO2 thin film preparation using dielectric barrier discharge-driven excimer lamps", Applied Surface Science 138-139, 1999, pp. 340-343.

* cited by examiner

METHOD OF MANUFACTURING LOW DIELECTRIC FILM BY A VACUUM ULTRAVIOLET CHEMICAL VAPOR DEPOSITION

BACKGROUND OF THE INVENTION

1. Field of the Invention

The present invention relates to a method of manufacturing a low dielectric film by a vacuum ultraviolet CVD.

2. Description of the Related Art

A SiOF film and a SiOC film formed by a plasma CVD are among conventional low dielectric films for use in a 64 Mb DRAM or later semiconductor devices.

The aforementioned method involves thermal treatment at a temperature higher than 350° C. and the occurrence of plasma discharge, causing damages to semiconductor devices. With increasing micro fabrication and multi-level interconnect of semiconductor devices, the adverse effects of the conventional method cannot be ignored in manufacturing reliable semiconductor devices.

SUMMARY OF THE INVENTION

The present invention was made in view of the aforementioned drawbacks of the conventional art. An object of the invention is to provide a vacuum ultraviolet CVD method in which an insulating film in the form of a low dielectric film can be manufactured at a temperature lower than 350° C., the insulating film being equivalent to or better than Si organic films (e.g., SiOC film) formed by a plasma CVD.

A method is used for forming a low relative permittivity dielectric film (SiOCH film, SiC film, and SiCH film) by a vacuum ultraviolet CVD. The dielectric film is a silicon organic film that has a controlled relative permittivity and is formed at temperatures below 350° C. The method can control the content of carbon in the insulating film to achieve a desired relative permittivity. That is, a desired relative permittivity can be obtained by: ① controlling the type and flow rate of added gas (e.g., $O_2$, $N_2O$) that contains oxygen atoms; ② controlling the flow rate of TEOS (tetraethyl orthosilicate); ③ controlling the intensity of light emitted from an excimer lamp; ④ elevating the temperatures of the synthetic quartz window and the gas flowing in a vacuum chamber, and controlling the distance between the synthetic quartz window and the wafer; and ⑤ controlling the temperature of the wafer.

Further scope of applicability of the present invention will become apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become fully understood from the detailed description given hereinbelow and the accompanying drawings which are given by way of illustration only, and thus are not limitative of the present invention, and wherein.

DETAILED DESCRIPTION OF THE INVENTION

The present invention will be described in detail with reference to the accompanying drawings.

First Embodiment

Figure 1:
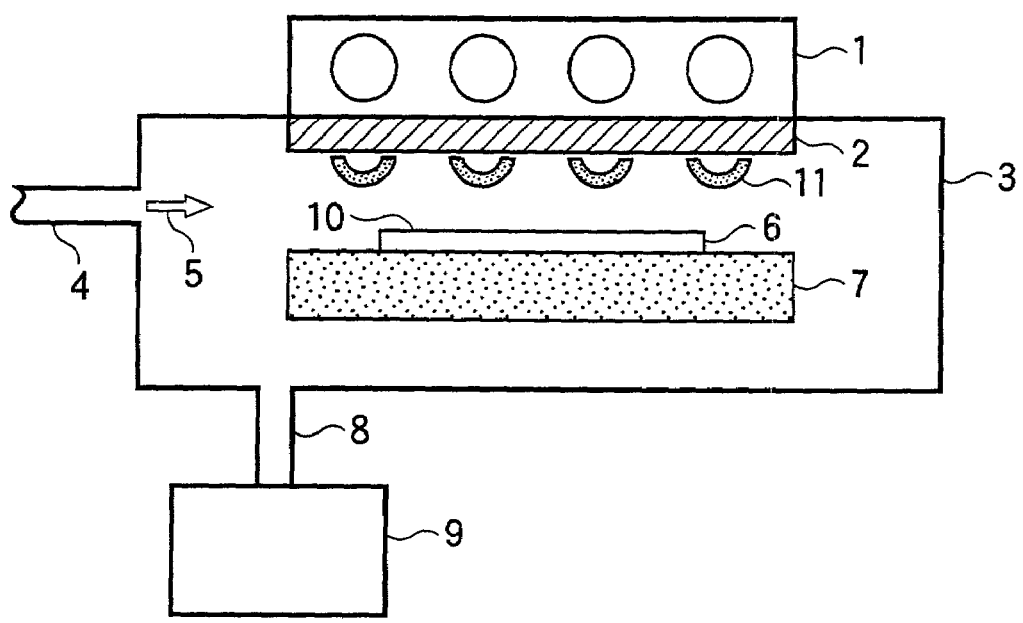
FIG. 1 is a cross-sectional view of a vacuum ultraviolet CVD apparatus.

FIG. 1 is a cross-sectional view of a vacuum ultraviolet CVD apparatus.

Referring to FIG. 1, an excimer lamp 1 is mounted above the vacuum chamber 3 with a synthetic quartz window 2 disposed therebetween. A wafer 6 is placed on a susceptor 7 in the chamber 3. A material gas or source gas 5 is introduced into the vacuum chamber 3 so that vacuum ultraviolet 11 illuminates the wafer 6 to form a low dielectric film on the wafer 6.

The $Xe_2$ excimer lamp 1 was turned on and vaporized TEOS (tetraethyl ortho silicate: $Si(OC_2H_5)_4$) was introduced into the vacuum chamber 3 with $O_2$ or $N_2O$ (i.e., added gas) added to TEOS, thereby forming a low dielectric film on a 6-in. silicon wafer 6. The process was carried out for 15 minutes. The flow rate of TEOS was 100 sccm. The partial pressure of TEOS was 300 mTorr. The temperature of the wafer 6 was room temperature, and the light intensity of the excimer lamp was 12 mW/cm2 immediately below the synthetic window 2.

The wafer 6 was disposed 15 mm below the synthetic quartz window 2. The light intensity under the synthetic quartz window 2 was measured by using a light meter (UIT-150/VUVS-172, manufactured by Ushio Denki).

Figure 2A:
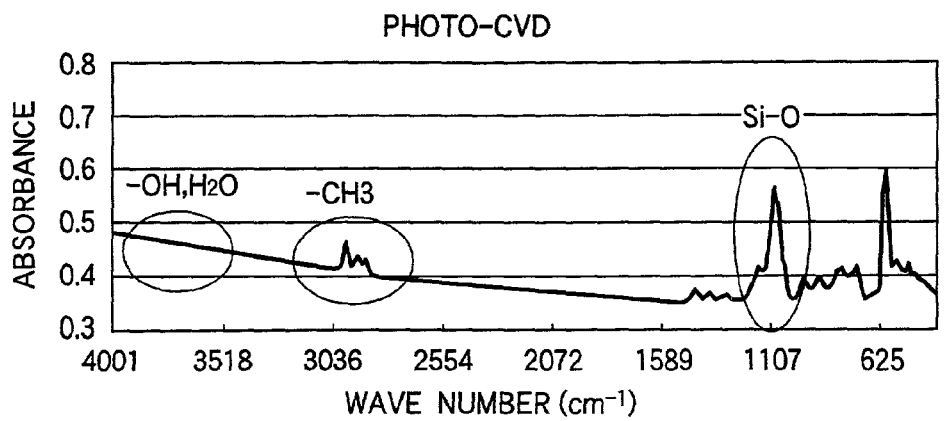
FIGS. 2A–2C illustrate the content of C when a gas (O2 or N2O) is added to vaporized TEOS and when a gas is not added to the vaporized TEOS, measured by a Fourier transform infrared spectroscopy.
Figure 2B:
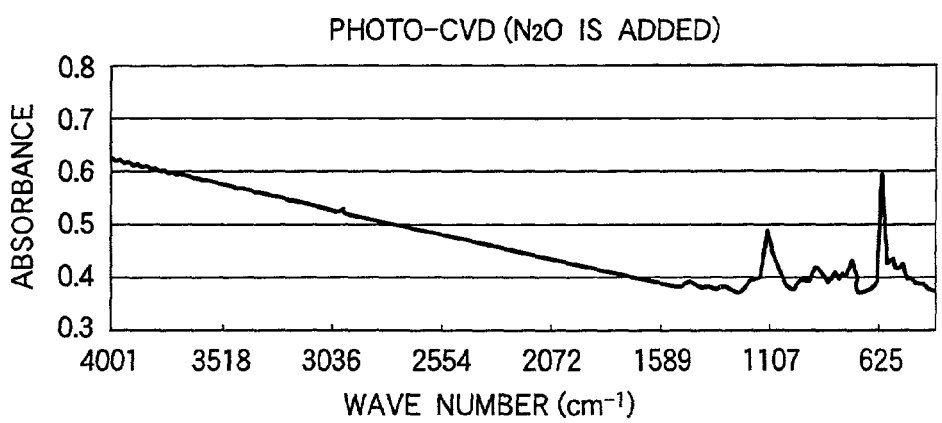
Figure 2C:
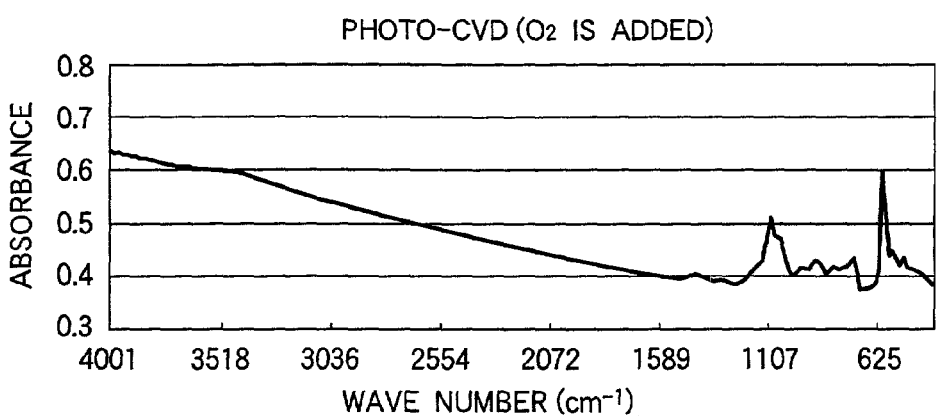

FIGS. 2A–2C illustrate the content of carbon C when a gas ($O_2$ or $N_2O$) is added to the vaporized TEOS and when a gas is not added to the vaporized TEOS, the content of carbon being measured by a Fourier transform infrared spectroscopy (referred to as FT-IR hereinafter) using the Newly Instrument IR-EPOCH. FIG. 2A illustrates the relationship between wave number ($cm^{-1}$) and absorbance when a low dielectric film was formed by a conventional photo CVD. FIG. 2B illustrates the relationship between wave number ($cm^{-1}$) and absorbance when a low dielectric film was formed using a conventional photo CVD by adding $N_2O$ gas to TEOS. FIG. 2C illustrates the relationship between wave number ($cm^{-1}$) and absorbance when a low dielectric film was formed using a conventional photo CVD by adding $O_2$ gas to TEOS.

As is clear from FIGS. 2A–2C, the photon energy emitted from the excimer lamp 1 converts oxygen O contained in the added gas into active oxygen to substitute OH group for CH group. Thus, selecting a type of an oxygen-containing gas to be added to TEOS and controlling the flow rate of the oxygen-containing gas allows the content of carbon C in the low dielectric film to be controlled.

Figure 3:
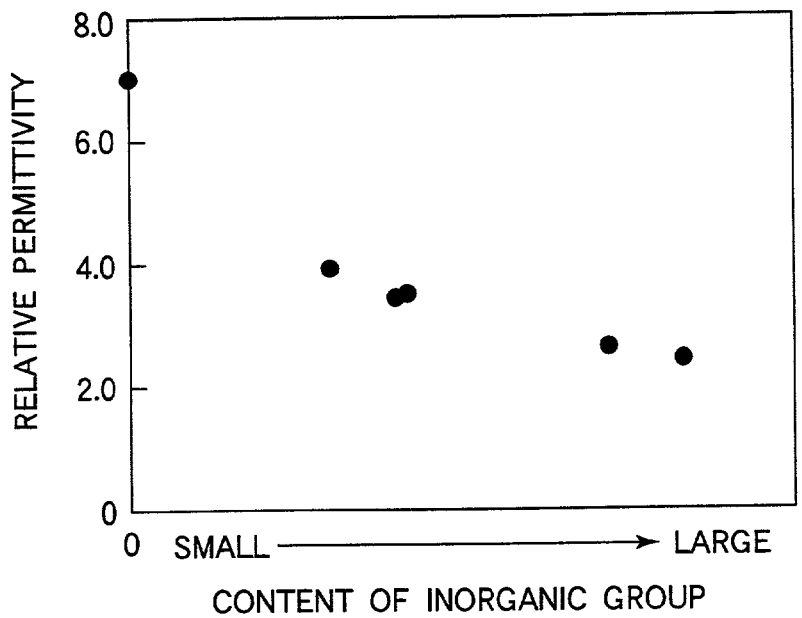
FIG. 3 illustrates the relationship between content of organic group in percentage and relative dielectric constant of SOG (spin on glass)

FIG. 3 illustrates the general relationship between the content of organic group in percentage and the relative permittivity of SOG (spin on glass) (Polymer Resin for Electronics "Technical trend of polymer having a low dielectric constant" published by TORE Research Center, issued on Sep. 1, 1999)

As is apparent from FIG. 3, the organic content determines relative dielectric constant. This fact suggests that relative dielectric constant of the insulating film 10 can be controlled by the aforementioned method.

Second Embodiment

A second embodiment uses the same vacuum ultraviolet CVD apparatus as the first embodiment. The $Xe_2$ excimer lamp 1 was turned on and vaporized TEOS was introduced into the vacuum chamber 3, thereby forming a low dielectric film on a 6-in. silicon wafer 6. The process was carried out for 50–420 minutes. A flow rate of TEOS was 5–50 sccm. The pressure of TEOS was 25–150 mTorr. The temperature of the wafer 6 was maintained at room temperature. The thickness of the formed low dielectric film was measured at a center of the 6-in. wafer 6 using a PROMETRIX thickness meter (model UV1250SE manufactured by KLA-Tencor Corporation).

The light intensity was 12 mW/cm² immediately below a 20-mm thick synthetic quartz window 2. The wafer 6 was 15 mm below the synthetic quartz window 2. The light intensity under the synthetic quartz window 2 was measured by using a light meter (UIT-150/VUVS-172, manufactured by Ushio Denki).

Figure 4:
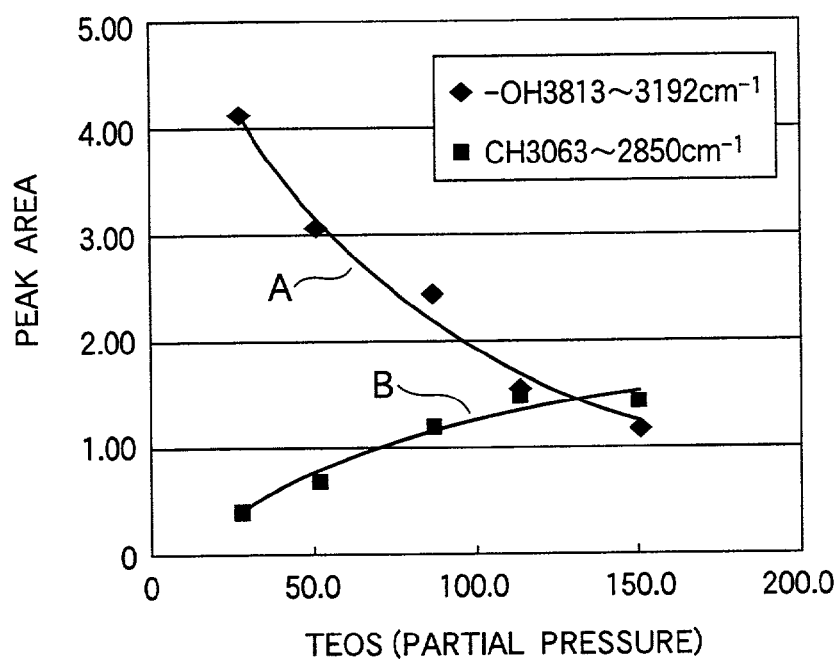
FIG. 4 plots TEOS pressure as the abscissa and peak area as the ordinate for CH-group and OH-group by the FT-IR.

FIG. 4 plots TEOS pressure as the abscissa and peak area as the ordinate for CH-group (containing C) and OH-group when the wafer was examined by the FT-IR. The film thickness varies depending on process time, and the pressure and flow rate of TEOS. Thus, the process time was adjusted so that all the films were 3000 Å thick.

Referring to FIG. 4, Curve A shows a case of —OH (reacted group) 3813–3192 $cm^{-1}$ and Curve B shows a case of CH (non-reacted group) 3063–2850 $cm^{-1}$.

As is clear from FIG. 4, the lower the flow rate of TEOS becomes, the more efficiently the photon energy of the excimer lamp 1 decomposes the TEOS, i.e., CH group decreases and OH group increases. Conversely, the higher, the flow rate of TEOS becomes, the less efficiently the photon energy of the excimer lamp 1 decomposes the TEOS, causing CH group (non-reacted group) to increase. This implies that controlling the flow rate of TEOS can control the content of carbon C in the insulating film 10, thereby controlling the relative dielectric constant of the insulating film 10.

Third Embodiment

A third embodiment uses the same vacuum ultraviolet CVD apparatus as the first embodiment. The $Xe_2$ excimer lamp 1 was turned on and vaporized TEOS was introduced into the vacuum chamber 3, thereby forming a low dielectric film on a 6-in. silicon wafer 6. The process was carried out for 15 minutes. A flow rate of the TEOS was 100 sccm. The pressure of TEOS was 300 mTorr. The temperature of the wafer 6 was room temperature. The process was carried out for light intensities of 10 mW/cm² and 30 mW/cm², respectively, measured immediately below the 20-mm thick synthetic quartz window 2.

The wafer 6 was located 15 mm below the synthetic quartz window 2. The light intensity below the synthetic quartz window 2 was measured by using a light meter (UIT-150/VUVS-172, manufactured by Ushio Denki).

Figure 5A:
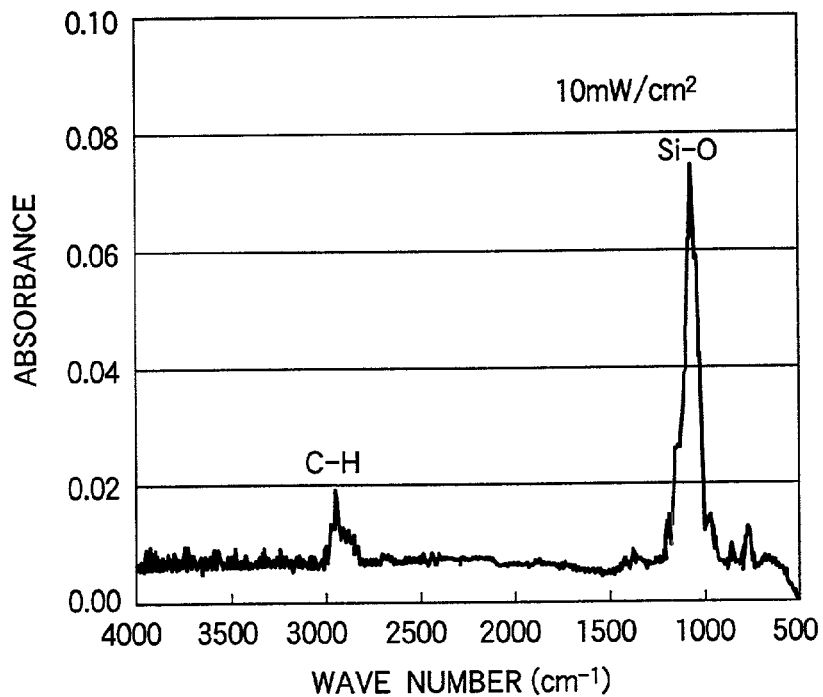
FIGS. 5A–5B illustrate the content of carbon for different light intensities, measured by the FT-IR using the Newly Instrument IR-EPOCH.
Figure 5B:
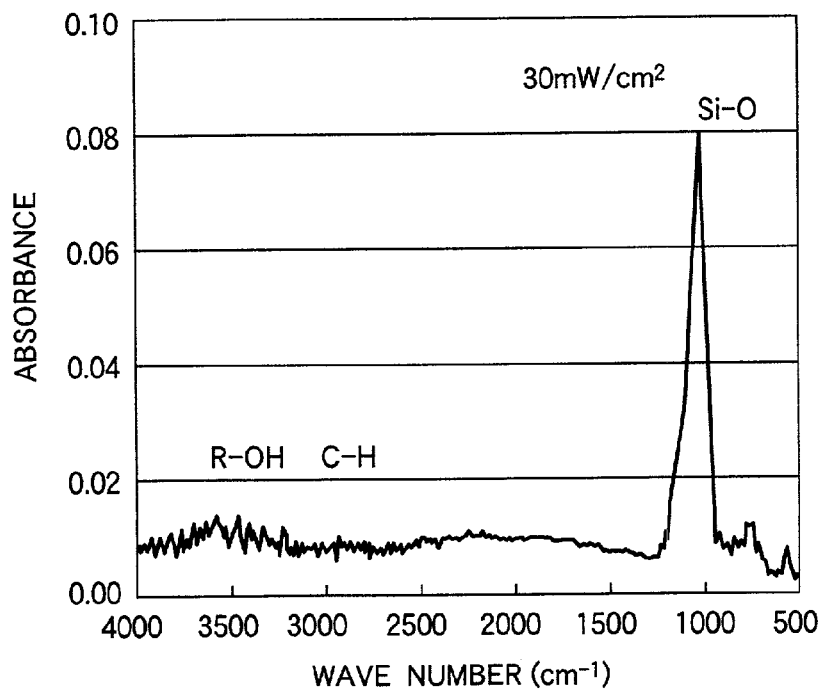

FIGS. 5A–5B illustrate the content of carbon C in the insulating film for different light intensities, measured by the FT-IR using the Newly Instrument IR-EPOCH. FIG. 5A illustrates the relationship between wave number ($cm^{-1}$) and absorbance when TEOS alone was used with a normal output of the excimer lamp 1. FIG. 5B illustrates the relationship between wave number ($cm^{-1}$) and absorbance when TEOS alone was used with a high output of the excimer lamp 1.

As is clear from FIGS. 5A and 5B, the higher the intensity of the light emitted from the excimer lamp 1 becomes, the more efficiently the photon energy of the excimer lamp 1 decomposes the TEOS, i.e., CH group decreases and OH group increases. Conversely, the lower the intensity of the light emitted from the excimer lamp 1 becomes, the less efficiently the photon energy of the excimer lamp 1 decomposes the TEOS, causing the increase in CH group.

This implies that controlling the flow rate of TEOS can control the content of carbon C in the insulating film 10, thereby controlling the relative dielectric constant of the insulating film 10.

Fourth Embodiment

A fourth embodiment uses the same vacuum ultraviolet CVD apparatus as the first embodiment. The $Xe_2$ excimer lamp 1 was turned on and vaporized TEOS was introduced into the vacuum chamber 3, thereby forming a low dielectric film on a 6-in. silicon wafer 6. The process was carried out for 15 minutes. The flow rate of TEOS was 50 sccm and the flow rate of $O_2$ was 50 sccm. The partial pressure of TEOS was 600 mTorr, and the light intensity immediately below the 20-mm thick synthetic quartz window 2 was 12 mW/cm². A heater was disposed on the synthetic quartz window 2 to warm up the synthetic quartz window 2 such that the temperature immediately below the synthetic quartz window 2 was 200° C.

The relationship between the wave number and absorbance was investigated for different gaps between the synthetic quartz window 2 and the wafer 6, the gaps ranging from 15 mm to 70 mm. The susceptor 7 on which the wafer 6 is carried is maintained at room temperature by circulating a coolant. The light intensity under the synthetic quartz window 2 was measured by using a light meter (UIT-150/VUVS-172, manufactured by Ushio Denki).

Figure 6:
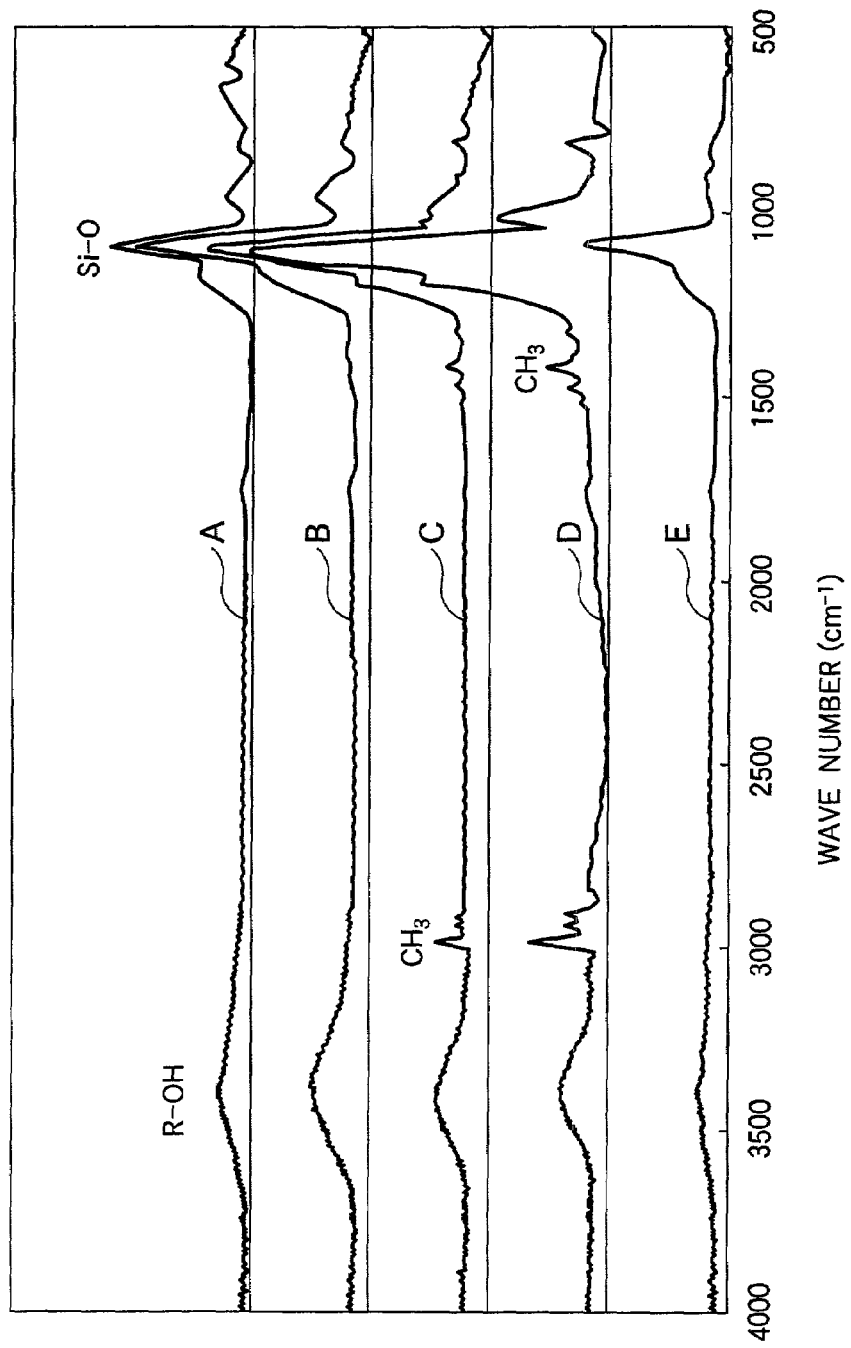
FIG. 6 illustrates the content of carbon for different gaps, measured by the FT-IR.

FIG. 6 illustrates the content of carbon C in the insulating film 10 for different gaps, and plots wave number ($cm^{-1}$) as the abscissa and absorbance as the ordinate. The content of carbon was measured by the FT-IR. Curve A shows the content of carbon when the gap was 70 mm and the temperature of the synthetic quartz window was 200° C. Curve B shows the content of carbon when the gap was 50 mm and the temperature of the synthetic quartz window was 200° C. Curve C shows the content of carbon when the gap was 20 mm and the temperature of the synthetic quartz window was 200° C. Curve D shows the content of carbon when the gap was 15 mm and the temperature of the synthetic quartz window was 200° C. Curve E shows the content of carbon when the gap was 20 mm and the temperature of the synthetic quartz window was not elevated.

As is apparent from FIG. 6, the smaller the gap becomes, the more OH group becomes and the more CH group becomes just as when no increase in window temperature is observed. Thus, the insulating film 10 contains more carbon C such that a peak value of CH3 is observed even at a wave number of around 1400 cm$^{-1}$. Conversely, the larger the gap becomes, the less CH group becomes. This implies that controlling the gap between the synthetic quartz window 2 and the wafer 6 allows controlling of the content of carbon C in the insulating film 10, thereby controlling relative dielectric constant in the insulating film 10.

Fifth Embodiment

A fifth embodiment uses the same vacuum ultraviolet CVD apparatus as the first embodiment. The $Xe_2$ excimer lamp 1 was turned on and vaporized TEOS was introduced into the vacuum chamber 3, thereby forming a low dielectric film on a 1-in. silicon wafer 6. The process was carried out for 30 minutes. The flow rate of TEOS before evaporation was 0.15–0.5 sccm, the chamber pressure was 0.75–1.5 Torr, and the light intensity immediately below a 3-mm thick $MgF_2$ window was about 8 mW/cm$^2$.

The process was carried out for three different temperatures, i.e., 25° C., 50° C., and 100° C., of the susceptor 7 on which the wafer 6 is carried. The light intensity immediately below the synthetic quartz window 2 was measured by using a light meter (UIT-150/VUVS-172, manufactured by Ushio Denki).

Figure 7:
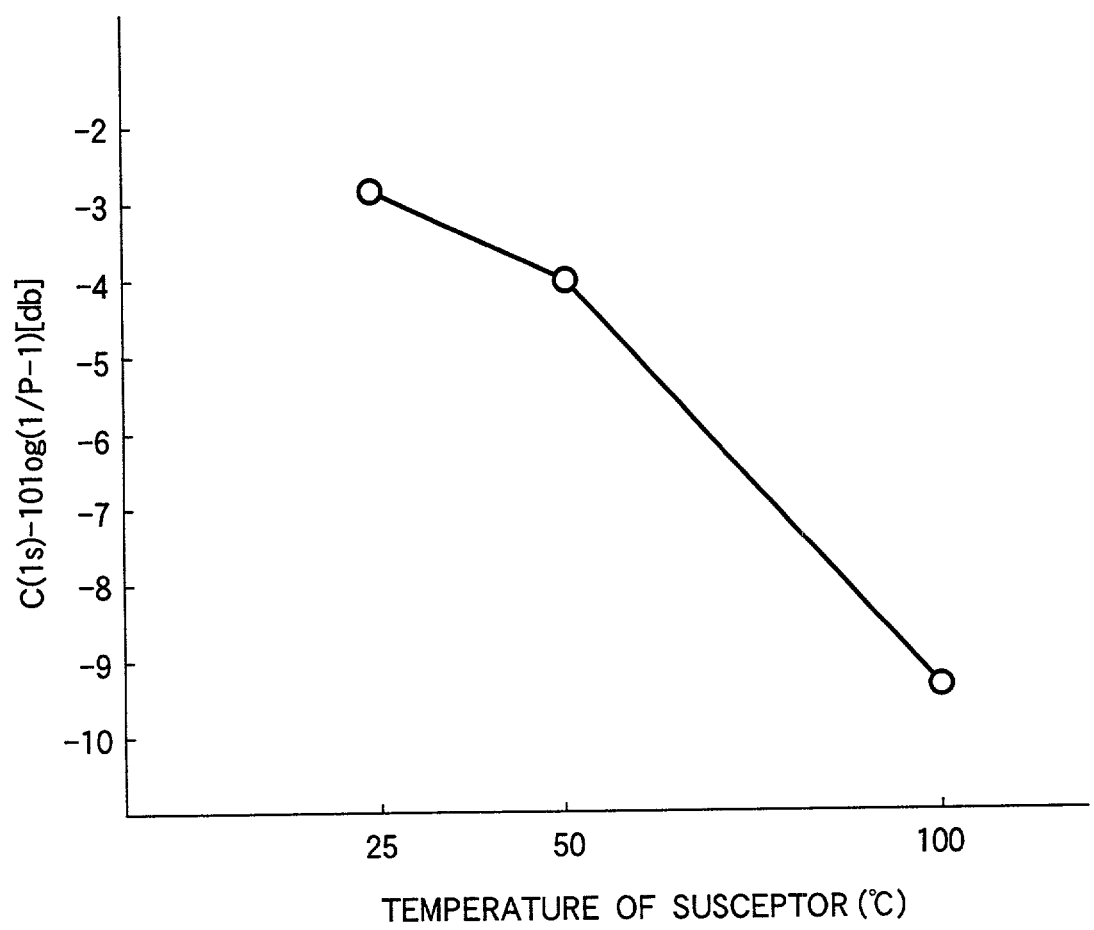
FIG. 7 illustrates factors and corresponding effects obtained by observing the peak value of C (1s) by the X-ray photoelectron spectroscopy.

FIG. 7 illustrates the relation between the temperature of the susceptor and the corresponding effects obtained by Taguchi Method. FIG. 7 plots the temperature of the susceptor as the abscissa and peak values of C (1s) measured by the X-ray photoelectron spectroscopy (referred to as XPS) as the ordinate. The larger the value of C(1s)-10log(1/P−1), the larger the C peak. The term C(1s) indicates a subshell in K-shell of carbon atom.

As is apparent from FIG. 7, the lower the temperature of the susceptor becomes, the less efficiently the photon energy of the excimer lamp 1 decomposes TEOS, i.e., more content of carbon C in the film 10. Conversely, the higher the temperature of the susceptor becomes, the more efficiently the photon energy of the excimer lamp 1 decomposes TEOS, so that the content of carbon C decreases. This implies that controlling the susceptor temperature allows controlling of the content of C, relative dielectric constant.

Sixth Embodiment

Figure 8:
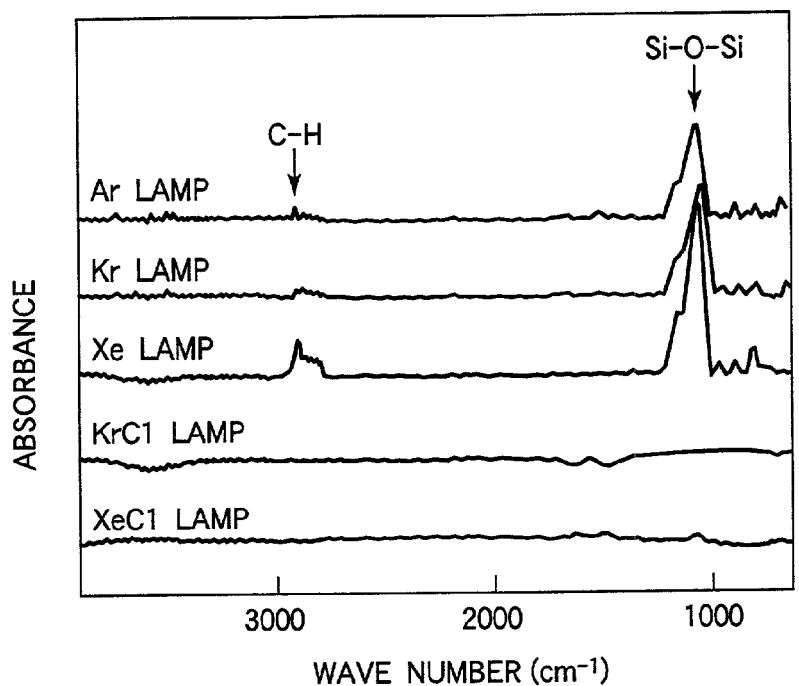
FIG. 8 illustrates the relationship between wave number ($cm^{-1}$) and absorbance for different types of excimer lamp measured by the FT-IR when TEOS alone is used.

FIG. 8 illustrates the relationship between wave number (cm$^{-1}$) and absorbance for different types of excimer lamp measured by the FT-IR when TEOS alone is used. When TEOS is used alone, the use of Xe lamp results in the largest increase in CH group.

Figure 9:
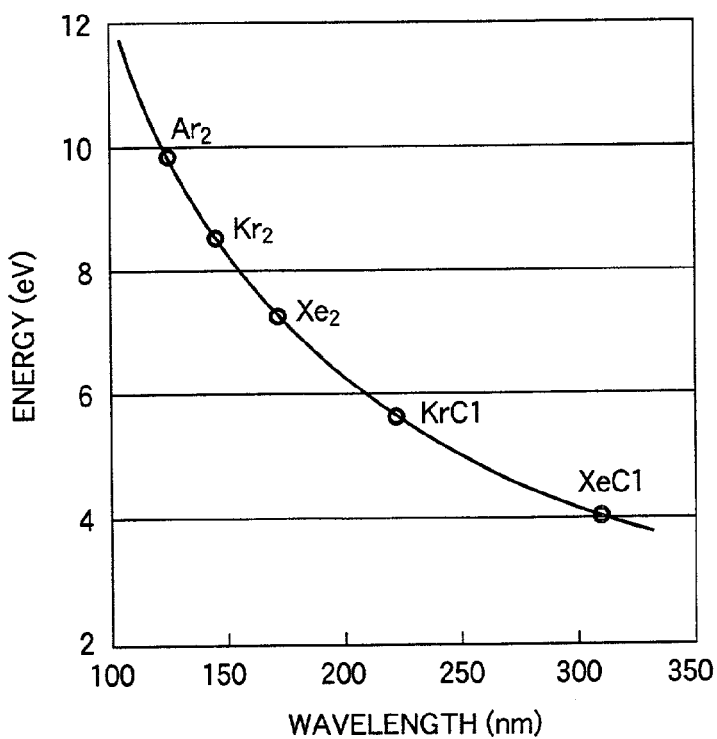
FIG. 9 illustrates the relationship between wave length and energy for the different types of excimer lamps.

FIG. 9 illustrates the relationship between wave length and energy for the different types of excimer lamps.

As shown in FIG. 9, the light emitted from the excimer lamp has different photon energy depending on the wavelength. The respective gases exhibit different absorbance bands of photon energy of the excimer lamp. As a result, the relative dielectric constant of the insulating film 10 can be controlled by selecting the type of source gas and the wavelength of the excimer lamp.

As described above, the present invention provides a method in which a low dielectric constant film having a controlled relative dielectric constant can be manufactured at temperatures below 350° C. That is, the vacuum ultraviolet CVD using TEOS can control the content of carbon C in the insulating film 10 by:

① controlling the type and flow rate of added gas (e.g., $O_2$, $N_2O$) that contains oxygen atoms, ② controlling the flow rate of TEOS, ③ controlling the intensity of light emitted from the excimer lamp, ④ elevating the temperature of the synthetic quartz window and the gas flowing through the vacuum chamber, and controlling the distance between the synthetic quartz window and the wafer, and ⑤ controlling the temperature of the wafer.

{Applications of the Invention}

The invention can find a variety of applications including isolation between elements and insulation between elements. The method also finds its applications (high dielectric constant films and low dielectric constant films) in the vacuum ultraviolet CVD that uses organic source gas other than TEOS.

The embodiment has been described with respect to vacuum ultraviolet of an excimer lamp but the method can equally be used using an excimer laser.

The present invention offers a method of manufacturing an insulating film at low temperatures below 350° C., the insulation film having a low dielectric constant that is at least equivalent to a silicon organic film (e.g.,SiOC film) formed by the plasma CVD.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A method of producing an insulating film on a silicon wafer, by vacuum ultraviolet CVD, wherein the film is a dielectric film which has a low relative permittivity and which comprises silicon and carbon wherein the method comprises:

providing a vacuum ultraviolet CVD apparatus including a vacuum chamber provided with a window;

placing a silicon wafer in the vacuum chamber;

causing TEOS to flow through the vacuum chamber, which is maintained at a temperature of less than 350° C.;

adding $O_2$ to TEOS;

exposing the wafer to light emitted from an excimer lamp through the window which causes decomposition of TEOS and formation of the dielectric film on the wafer;

controlling the carbon content of the dielectric film which controls the relative permittivity by the steps consisting essentially of:

elevating the temperature in the atmosphere in the chamber, and controlling a distance between the window and the wafer.

2. The method of claim 1, where said controlling said carbon content further comprises one of two steps selected from the group consisting of (1) increasing the partial pressure of the first gas and of the source of silicon and of carbon to increase the organic content of the dielectric film and (2) decreasing the partial pressure of the first gas and of the source of silicon and of carbon to decrease the organic content of the dielectric film.

3. The method of claim 1, wherein exposing the wafer to light comprises at least one of two steps selected from the group consisting of (a) increasing light intensity to decrease CH content in said dielectric film and (b) decreasing light intensity to increase CH content in said dielectric film.

4. The method of claim 2, wherein exposing the wafer to light comprises at least one of two steps selected from the group consisting of (a) increasing light intensity to decrease CH content in said dielectric film and (b) decreasing light intensity to increase CH content in said dielectric film.

5. A method of producing an insulating film on a silicon wafer, by vacuum ultraviolet CVD, wherein the film is a dielectric film which has a low relative permittivity and which comprises silicon and carbon wherein the method comprises:
   providing a vacuum ultraviolet CVD apparatus including a vacuum chamber provided with a window;
   placing a silicon wafer in the vacuum chamber;
   causing TEOS to flow through the vacuum chamber, which is maintained at a temperature of less than 350° C.;
   adding $O_2$ to TEOS, to produce a reactant feed consisting essentially of $O_2$ and TEOS;
   exposing the wafer through the window, to a light intensity which comprises a range of 10 mW/cm$^2$ to 30 mW/cm$^2$ and wherein said exposure causes decomposition of TEOS and formation of the dielectric film,
   wherein exposing at a light intensity at a higher end of said range results in less carbon in the dielectric film than an amount of carbon in another dielectric film produced on exposing to a light intensity at a lower end of said range,
   wherein the carbon content of the dielectric film determines the relative permittivity.

6. The method of claim 5, wherein the reactant feed consists of $O_2$ and TEOS.

7. A method of producing an insulating film on a silicon wafer, by vacuum ultraviolet CVD, wherein the film is a dielectric film which has a low relative permittivity and which comprises silicon and carbon wherein the method comprises:
   providing a vacuum ultraviolet CVD apparatus including a vacuum chamber provided with a window;
   placing a silicon wafer in the vacuum chamber;
   causing TEOS to flow through the vacuum chamber, which is maintained at a temperature of less than 350° C.;
   adding $O_2$ to TEOS;
   exposing the wafer to light emitted from an excimer lamp through the window which causes decomposition of TEOS and formation of the dielectric film on the wafer;
   controlling the carbon content of the dielectric film which controls the relative permittivity by controlling temperature, wherein at a temperature at a high end of said range of less than 350° C., there is less carbon in the dielectric film than there is carbon in another dielectric film produced at a temperature less than said high end.

8. The method of claim 7, wherein the light intensity is in a range comprising 10 mW/cm$^2$ to 30 mW/cm$^2$.

9. A method of producing an insulating film on a silicon wafer, by vacuum ultraviolet CVD, wherein the film is a dielectric film which has a low relative permittivity and which comprises silicon and carbon wherein the method comprises:
   providing a vacuum ultraviolet CVD apparatus including a vacuum chamber provided with a window;
   placing a silicon wafer in the vacuum chamber;
   causing TEOS to flow through the vacuum chamber, which is maintained at a temperature of less than 350° C.;
   adding $O_2$ to TEOS, to produce a reactant feed consisting essentially of $O_2$ and TEOS;
   exposing the wafer through the window, to a light intensity which is in a range of 10 mW/cm$^2$ to 30 mW/cm$^2$ and wherein said exposure causes decomposition of TEOS and formation of the dielectric film,
   controlling a flow rate of said TEOS, into the vacuum chamber, wherein, at a lower flow rate, carbon in the dielectric film is present in an amount less than an amount of carbon resulting in another dielectric film produced at TEOS flow rates higher than said lower flow rates.

* * * * *